United States Patent
Poveda

(10) Patent No.: US 7,005,725 B2
(45) Date of Patent: Feb. 28, 2006

(54) DISCRETE COMPONENT COMPRISING HF DIODES IN SERIES WITH A COMMON CATHODE

(75) Inventor: Patrick Poveda, Villedomer (FR)

(73) Assignee: STMicroelectronics S.A., Montrouge (FR)

(*) Notice: Subject to any disclaimer, the term of this patent is extended or adjusted under 35 U.S.C. 154(b) by 111 days.

(21) Appl. No.: 10/744,407

(22) Filed: Dec. 23, 2003

(65) Prior Publication Data

US 2004/0135235 A1 Jul. 15, 2004

(30) Foreign Application Priority Data

Dec. 27, 2002 (FR) .................... 02/16809

(51) Int. Cl.
*H01L 31/105* (2006.01)
(52) U.S. Cl. ..................... 257/656; 257/655
(58) Field of Classification Search ........... 257/655, 257/656
See application file for complete search history.

(56) References Cited

U.S. PATENT DOCUMENTS

| 3,686,684 A | 8/1972 | Matsushita et al. |
| 3,710,206 A | 1/1973 | Matsushita |
| 4,182,965 A | 1/1980 | Pfleiderer |

OTHER PUBLICATIONS

French Search Report from French Patent Application 02/16809, filed Dec. 27, 2002.

*Primary Examiner*—Roy Potter
(74) *Attorney, Agent, or Firm*—Lisa K. Jorgenson; James H. Morris; Wolf, Greenfield & Sacks, P.C.

(57) ABSTRACT

An electric component comprising an assembly of two PIN diodes in series formed in a semiconductor substrate layer separated from a support layer by an insulating layer, the doped areas forming the electrodes of each diode having a depth equal to that of the substrate layer, the component including a first area of a first doping type surrounded with a second intrinsic area, itself surrounded with a third area of a second doping type, the third area being surrounded with a fourth area of the first doping type, the fourth area being surrounded with a fifth intrinsic area, itself surrounded with a sixth area of the second doping type, the third and fourth areas being covered and connected by a metal area, each of the first and sixth areas being connected to a contact pad on which rests a welding ball.

7 Claims, 3 Drawing Sheets

DISCRETE COMPONENT COMPRISING HF DIODES IN SERIES WITH A COMMON CATHODE

BACKGROUND OF THE INVENTION

1. Field of the Invention

The present invention relates to rectifying diodes capable of operating at high frequency. More specifically, the present invention relates to diodes formed in a "flip-chip"—assembled integrated circuit chip. Flip-chips chips are such that the contact pads connected to the anodes and cathodes of the diodes are formed on the same side of the chip and are covered with welding balls used to attach by welding the component on a printed circuit.

2. Discussion of the Related Art

Such diodes are especially used in radio wave transceiver circuits.

FIG. 1 shows as an example a diagram of a portion of a transceiver circuit usable in portable phones and comprising high-frequency PIN diodes.

The circuit comprises an antenna 1, two transmit branches br1 and br2, and two receive branches br3 and br4. Transmit branch br1 contains a diode D1 and a capacitor C1 in series. The cathode of diode D1 is connected to antenna 1 and an electrode of capacitor C1 is connected to a signal terminal TXGSM. Transmit branch br2 contains a capacitor C2 in series with a diode D2. The cathode of diode D2 is connected to antenna 1 and an electrode of capacitor C2 is connected to a terminal CXPCF/PCF. Transmit branch br3 contains a capacitor C3 and two diodes D31 and D32 in series. An electrode of capacitor C3 is connected to a terminal RXGSM. The other electrode of capacitor C3 is connected to the anode of diode D31, the cathode of which is connected to the anode of diode D32. The cathode of diode D32 is connected to antenna 1. Receive branch br4 contains a capacitor C4 and two diodes D41 and D42 in series. An electrode of capacitor C4 is connected to a terminal RXDCS. The other electrode of capacitor C4 is connected to the anode of diode D41, the cathode of which is connected to the anode of diode D42. The cathode of diode D42 is connected to antenna 1.

Bias circuits p1, p2, p3, and p4 are connected to branches br1, br2, br3, and br4. Each bias circuit pi, i ranging between 1 and 4, comprises a capacitor Cpi. A first electrode of each capacitor Cpi is grounded. The second electrode of each capacitor Cpi is connected to a first terminal of a coil Bi. The second terminal of each coil Bi is connected to the intermediary point between the capacitor and the diode(s) of branch bri. The second electrodes of capacitors Cp1, Cp2, Cp3, and Cp4 are respectively connected to bias terminals BIAS-TXGSM, BIAS-TXDCS/PCS, BIAS-RXGSM, and BIAS-RXDCS.

Antenna 1 is connected to a common bias circuit 2. Bias circuit 2 comprises a coil Bc having a first terminal connected to antenna 1. The second terminal of coil Bc is connected to a first electrode of a capacitor Cc having its second electrode connected to ground. Two resistors R1 and R2 in series are placed between the first electrode of capacitor Cc and the ground. The intermediary point between resistors R1 and R2 is connected to a bias terminal BIAS.

When the circuit is in receive mode, for example on terminal RXGSM, terminals BIAS-TXGSM, BIAS-TXDCS/PCS, and BIAS-RXDCS are grounded and no current flows through the diodes of branches br1, br2, and br4. Terminal BIAS-RXGSM is positively biased and a current flows through coil B3, diodes D31 and D32, coil Bc, and resistors R1 and R2. Capacitor C3 behaving as a short-circuit at high frequency, the signal received on antenna 1 is transmitted onto terminal RXGSM.

When the circuit is in transmit mode, for example on terminal TXGSM, terminals BIAS-TXDCS/PCS, BIAS-RXGSM, and BIAS-RXDCS are grounded. Terminal BIAS-TXGSM is positively biased. The signal to be transmitted is transmitted from terminal TXGSM to antenna 1.

Such a circuit comprises a large number of diodes. Currently, these diodes are made in the form of discrete components. Their costs and the printed circuit surface area taken up by the diodes are thus significant.

SUMMARY OF THE INVENTION

An object of the present invention is to form high-frequency circuits comprising several monolithic diodes.

Another object of the present invention is to provide such a diode assembly which reduces high-frequency interferences.

To achieve these and other objects, the present invention provides an electric component comprising an assembly of two PIN diodes in series formed in a semiconductor substrate layer separated from a support layer by an insulating layer, the doped areas forming the electrodes of each diode having a depth equal to that of the substrate layer, the component comprising a first area of a first doping type surrounded with a second intrinsic area, itself surrounded with a third area of a second doping type, the third area being surrounded with a fourth area of the first doping type, the fourth area being surrounded with a fifth intrinsic area, itself surrounded with a sixth area of the second doping type, the third and fourth areas being covered and connected by a metal area, each of the first and sixth areas being connected to a contact pad on which rests a welding ball.

According to an alternative embodiment of such a component, the first area has a cylindrical shape and the second, third, fourth, and fifth areas are ring-shaped.

The present invention further provides an electric circuit comprising several diodes formed in a substrate layer separated from a support layer by an insulating layer, the diodes being distributed on one or several branches, first branches comprising two diodes in series formed like the above-mentioned component, second branches comprising a single diode formed of a first area of the first doping type surrounded with a second intrinsic area itself surrounded with a third area of the second doping type, the sixth areas of the diodes of the first branches and the third areas of the diodes of the second branches forming a single common area.

According to an alternative embodiment of such a circuit, the single common area is connected to at least one contact pad, each of the first areas of the diodes of the first and second branches being connected to a contact pad.

According to an alternative embodiment of such a circuit, the first areas have a cylindrical shape and the second, third, fourth, and fifth areas of the diodes of the first branches and the second area of the diodes of the second branches are ring-shaped.

According to an alternative embodiment of such a circuit, the single common area is covered with a metal area extending above portions of the single common area separating the other doped or intrinsic areas of the different diodes.

According to an alternative embodiment of such a circuit, the first doping type is a P doping and the second doping type is an N doping, said first area being an anode area and said third area being a cathode area.

The foregoing objects, features, and advantages of the present invention will be discussed in detail in the following non-limiting description of specific embodiments in connection with the accompanying drawings.

DETAILED DESCRIPTION

The present invention provides forming on a single semiconductor chip an assembly of high-frequency diodes assembled in series and/or with a common cathode.

The applicant has selected from among the various existing structures of high-frequency diodes a "lateral" diode structure formed in a silicon-on-insulator (SOI) type support. Such diodes exhibit a very low stray capacitance.

Figure 1:
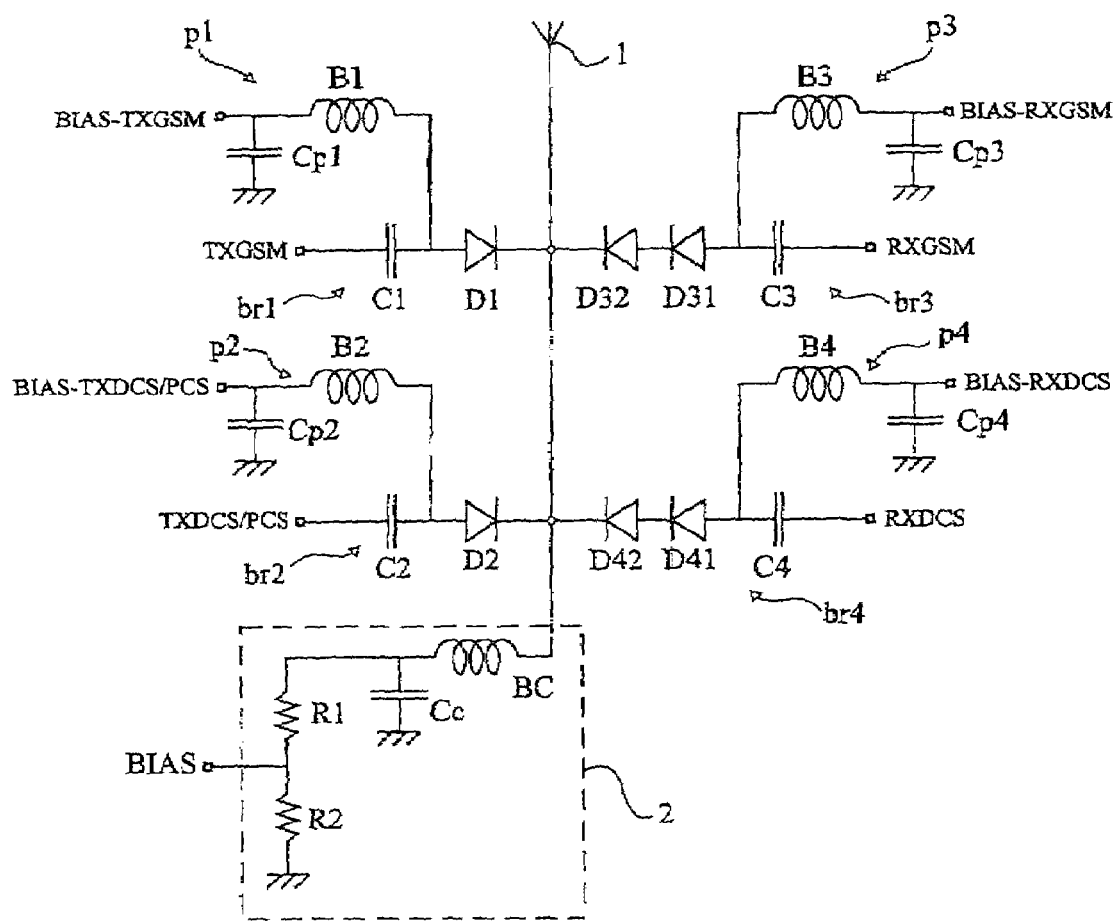
FIG. 1 is an example of a known transceiver circuit.
Figure 2:
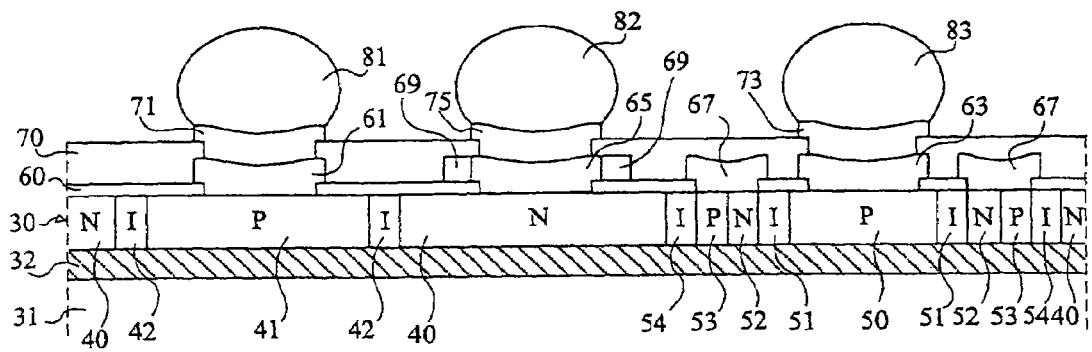
FIG. 2 is a vertical cross-section view of a diode assembly according to the present invention.
Figure 3:
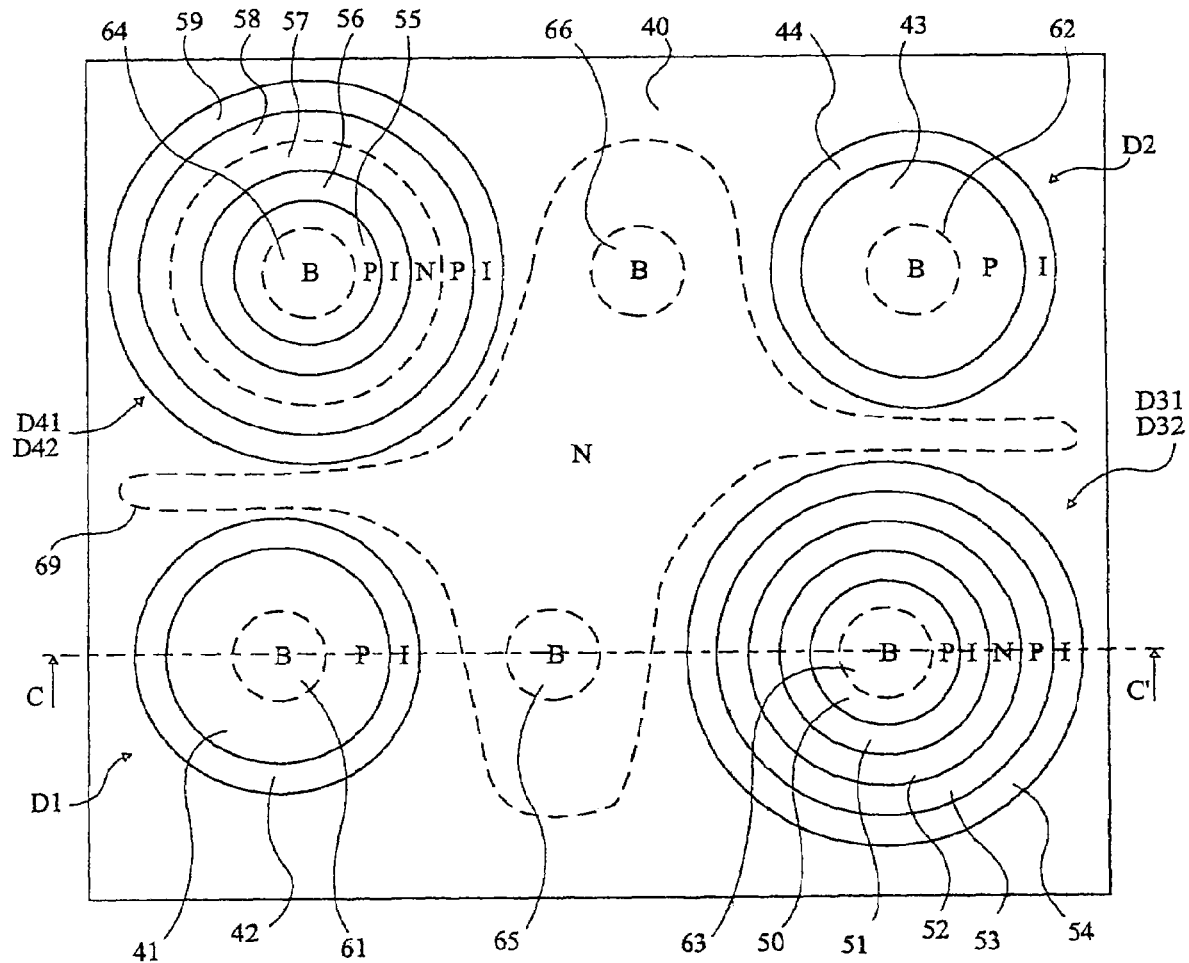
FIG. 3 is a top view of the electric component shown in FIG. 2.

FIGS. 2 and 3 show an assembly of diodes comprising diodes in series and diodes with a common cathode forming an example of application of the present invention. This specific assembly forms an electric component which corresponds to the portion of the transceiver circuit shown in FIG. 1 comprising diode assembly D1, D2, D31, D32, D41, and D42.

FIG. 2 is a vertical cross-section view of the electric component along axis 22' of FIG. 3. FIG. 3 is a top view of the electric component without its metallizations.

The electric component is made in a thin substrate layer 30 separated from a support layer 31 by an insulating layer 32. Substrate layer 30, for example, silicon, is initially little or not doped, that is, intrinsic. Insulating layer 32 may be silicon oxide and the support layer for example silicon, glass or sapphire. In the following, each time a doped area of the component formed in the substrate will be mentioned, it will be a doped area extending over the entire thickness of substrate layer 30.

Series diodes D31/D32 and D41/D42 are formed similarly, only diode D31 and D32 being shown in FIG. 2. The anode of diode D31 is a P-doped cylindrical area 50. Area 50 is surrounded with five concentric annular areas. Area 50 is surrounded with an intrinsic area 51, itself surrounded with an N-doped area 52 forming the cathode of diode D31. Area 52 is surrounded with a P-doped area 53 forming the anode of diode D32. Area 53 is surrounded with an intrinsic area 54. Similarly, the anode of diode D41 is a P-doped cylindrical area 55. Area 55 is surrounded with five concentric annular areas. Area 55 is surrounded with an intrinsic layer 56 itself surrounded with an N-doped area 57 forming the cathode of diode D41. Area 57 is surrounded with a P-doped area 58 forming the anode of diode D42. Area 58 is surrounded with an intrinsic area 59.

Diodes D1, D2, D32, and D42 have a common cathode corresponding to an N-doped substrate area 40. Area 40 corresponds to the substrate area not taken up by the other doped or intrinsic areas of the diode assembly.

Substrate layer 30 is covered with an insulating layer 60. Openings formed in insulating layer 60 above the anode and cathode areas of each of the diodes contain metallizations which correspond to contact pads or connection areas. The connection areas enable connecting juxtaposed anode and cathode areas belonging to two diodes in series such as diodes D31 and D32. The contact pads and the connection areas are formed of a conductive material, such as aluminum or copper.

Metal contact pads 61, 62, 63, and 64 having in this example a circular shape in top view are placed above and at the center of anode areas 41, 43, 50, and 55. Metal contact pads 65 and 66 are placed above selected locations of common cathode area 40. The contact pads are shown in dotted lines in FIG. 3. The contact pads have in this example a circular shape in top view.

A metal area 67 covers annular areas 52 and 53 to short-circuit the diode formed by the two juxtaposed areas and place diodes D31 and D32 in series. Similarly, a metal area 68, not shown, covers annular areas 57 and 58.

Insulating layer 60 is covered with a passivation layer 70. Openings formed in passivation layer 70 above contact pads 61, 65, 63, 64, 66, and 62 are respectively filled with bonding layers 72, 73, 74, 75, and 76 on which are placed welding balls 81, 82, 83, 84, 85, and 86. These welding balls enable welding the electric component on a printed circuit.

According to an embodiment of the present invention, the metal layer forming circular contact pads 65 and 66 placed above cathode area 40 extends in a metal area 69 shown in doted lines in FIG. 3. The shape of metal area 69 is provided so that it extends above the portions of area 40 separating the other intrinsic or doped areas of the different diodes. Metal area 64 enables forming a shielding between the different diodes and thus decreasing electromagnetic interferences between these diodes.

FIGS. 4 to 7 are vertical cross-section views of the structures obtained at successive steps of a component manufacturing method such as described in relation with FIGS. 2 and 3. The same reference numerals designate the elements of the previously-described electric component and the elements of the various structures described hereafter.

A first step of the method of the present invention comprises forming or of using an SOI-type substrate. Such a support comprises a semiconductor substrate layer 30, such as silicon, separated from a support layer 31, by an insulating layer 32, conventionally a silicon oxide layer.

Figure 4:
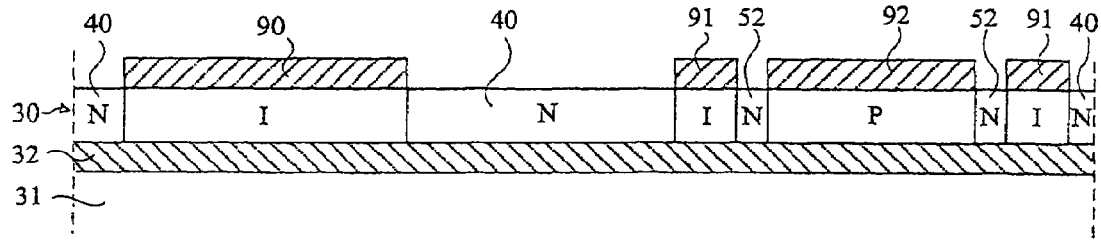
FIGS. 4 to 7 illustrate the structures obtained after successive steps of a method according to the present invention.

In a next step, illustrated in FIG. 4, substrate layer 30 is implanted with, for example, phosphorus to form the N doped areas of the cathodes of the electric component diodes. As shown in FIG. 4, the areas which are not desired to be N doped are covered with protection layers 90, 91, and 92. The N doped areas shown in FIG. 4 correspond to areas 40 and 52 of the component shown in FIG. 2.

Figure 5:
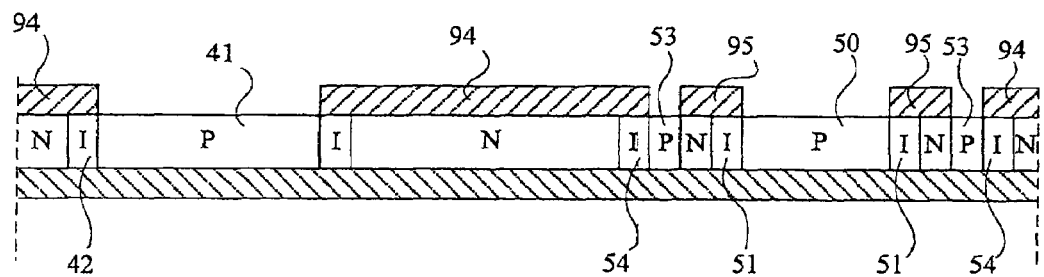

In a next step, illustrated in FIG. 5, substrate layer 30 is implanted with, for example, boron to form the P doped areas of the anodes of the electric component diodes. The already N-doped areas of substrate 30 or the areas which are desired to be left in the intrinsic state are covered with protection layers 94 and 95. The P doped areas shown in FIG. 5 correspond to areas 41, 50, and 53 of the component shown in FIG. 2.

The areas not doped after the preceding steps of the method of the present invention form intrinsic areas. In the example of FIG. 5, intrinsic areas 42, 51, and 54 can be seen.

Figure 6:
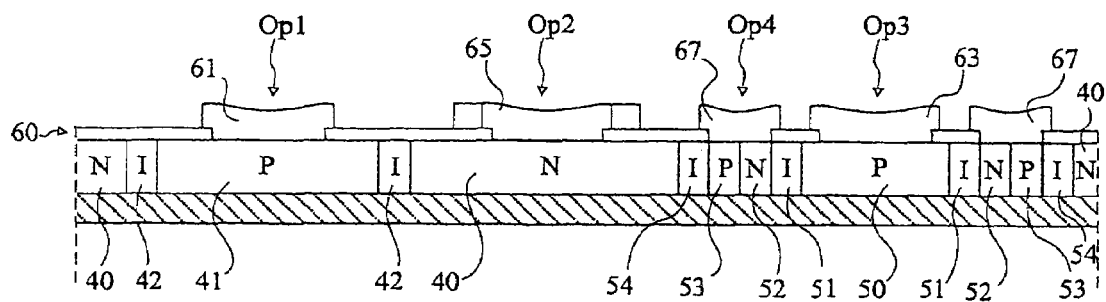

At the step illustrated in FIG. 6, substrate layer 30 is covered with an insulating layer 60. Openings Op1, Op2, Op3, and Op4 are formed by etching above the anode and cathode areas, that is, areas 41, 40, 50, 52, and 53 in this example. A conductive material such as aluminum is then deposited above insulating layer 60. Then, the aluminum is etched to keep aluminum in openings Op1 to Op4. Aluminum contact pads 61, 65 (69), and 63 respectively formed above areas 41, 40, and 50 as well as connection areas, area 67 in this example, are thus obtained. The connection areas short-circuit the juxtaposed anode and cathode areas of two diodes in series, that is, areas 52 and 53 in this example.

Figure 7:
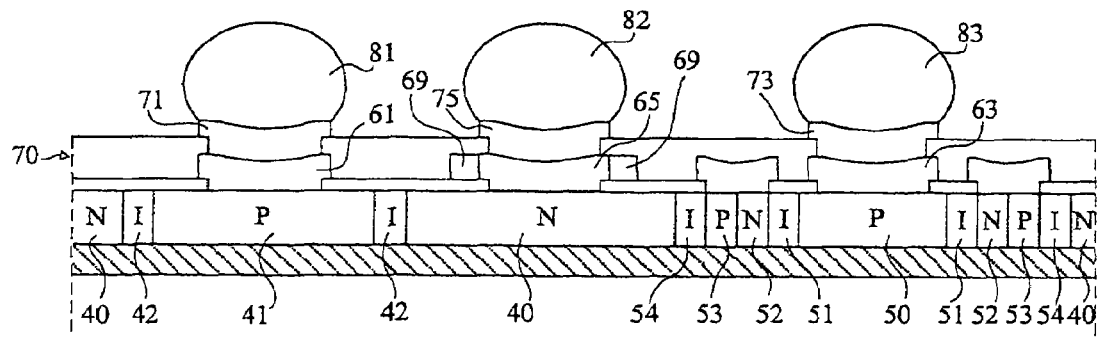

At the step illustrated in FIG. 7, insulating layer 60, the contact pads, and the connection areas are covered with a passivation layer 70.

Openings are formed by etching in passivation layer 70 above metal contact pads 61, 65, and 63 and respectively filled with bonding layers 72, 73, 74, 75, and 76. Welding balls 81, 82, 83, 84, 85, and 86 are respectively formed on bonding layers 72, 73, 74, 75, and 76.

Of course, the present invention is likely to have various alterations, modifications, and improvements which will readily occur to those skilled in the art. In particular, the implantation steps may be carried out in a different order.

Further, it may be provided to place several contact pads on the common cathode area and to distribute them to obtain a robust assembly of the electric component on a printed circuit.

Further, an electric component "complementary" to the previously-described component may be formed. Such a component is formed, as previously, of an assembly of diodes distributed over several branches, the branches containing one or two diodes in series. Conversely to the described component, the branches are interconnected by the anode of one of the diodes of each branch. Such a "complementary" component has a structure similar to that of the described component, except that the different doped areas have a doping of opposite type.

As an alternative, anode or cathode areas in the case of the complementary component exhibiting a square, rectangular, or other top view may be formed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An electric component comprising an assembly of two PIN diodes in series formed in a semiconductor substrate layer separated from a support layer by an insulating layer, the doped areas forming the electrodes of each diode having a depth equal to that of the substrate layer, the component comprising a first area of a first doping type surrounded with a second intrinsic area, itself surrounded with a third area of a second doping type, the third area being surrounded with a fourth area of the first doping type, the fourth area being surrounded with a fifth intrinsic area, itself surrounded with a sixth area of the second doping type, the third and fourth areas being covered and connected by a metal area, each of the first and sixth areas being connected to a contact pad on which rests a welding ball.

2. The component of claim 1, wherein the first area has a cylindrical shape and the second, third, fourth, and fifth areas are ring-shaped.

3. An electric circuit comprising several diodes formed in a substrate layer separated from a support layer by an insulating layer, the diodes being distributed on one or several branches, first branches comprising two diodes in series formed according to claim 1, second branches comprising a single diode formed of a first area of the first doping type surrounded with a second intrinsic area, itself surrounded with a third area of the second doping type, the sixth areas of the diodes of the first branches and the third areas of the diodes of the second branches forming a single common area.

4. The circuit of claim 3, wherein the single common area is connected to at least one contact pad, each of the first areas of the diodes of the first and second branches being connected to a contact pad.

5. The circuit of claim 4, wherein the first areas have a cylindrical shape and the second, third, fourth, and fifth areas of the diodes of the first branches and the second area of the diodes of the second branches are ring-shaped.

6. The circuit of claim 3, wherein the single common area is covered with a metal area extending above portions of the single common area separating the other doped or intrinsic areas of the different diodes.

7. The component of claim 1, wherein the first doping type is a P doping and the second doping type is an N doping, said first area being an anode area and said third area being a cathode area.

* * * * *